United States Patent
Ao et al.

(10) Patent No.: US 6,285,253 B1
(45) Date of Patent: Sep. 4, 2001

(54) SYSTEMS, METHODS, AND CIRCUITS FOR REDUCING HUM MODULATION IN AMPLIFIERS

(75) Inventors: Jiening Ao, Suwanee; Steven E. Blashewski, Duluth; John W. Brickell, Lawrenceville; Pieter G. Ibelings, Norcross, all of GA (US)

(73) Assignee: Scientific-Atlanta, Inc., Lawrenceville, GA (US)

(*) Notice: Subject to any disclaimer, the term of this patent is extended or adjusted under 35 U.S.C. 154(b) by 0 days.

(21) Appl. No.: 09/473,850

(22) Filed: Dec. 28, 1999

(51) Int. Cl.$^7$ .................................................. H03F 1/32
(52) U.S. Cl. .................................... 330/149; 330/141
(58) Field of Search .............................. 330/141, 149, 330/281, 302, 306

(56) References Cited

U.S. PATENT DOCUMENTS 5,255,094 * 10/1993 Yong et al. ...................... 330/51 X
5,892,401 * 4/1999 Crampton et al. ................. 330/277

\* cited by examiner

*Primary Examiner*—Steven J. Mottola
(74) *Attorney, Agent, or Firm*—Hubert J. Barnhardt, III; Kelly A. Gardner; Kenneth M. Massaroni

(57) ABSTRACT

Voltage-induced hum modulation in an amplifier can be caused when shunt capacitors begin to saturate and enter their non-linear region of operation. Bypass coils within the amplifier are magnetically coupled to the shunt capacitors and exacerbate hum modulation by coupling additional energy to the shunt capacitors. By introducing a resistance (R) in series with the shunt capacitors (C), energy that would normally be stored in the shunt capacitors (C) is dissipated. As a result, the shunt capacitors (C) remain in their linear region of operation more often and present a more stable impedance. The resistor (R) is especially beneficial at reducing hum modulation at the resonant frequency of the shunt capacitors (C), when the transfer of energy from the bypass coils (L) is at a maximum.

3 Claims, 6 Drawing Sheets

FIG. 2: Hum Distortion.

FIG. 3: Hum Measurement.

SYSTEMS, METHODS, AND CIRCUITS FOR REDUCING HUM MODULATION IN AMPLIFIERS

FIELD OF THE INVENTION

This invention relates generally to systems, methods, and circuits for amplifying and. more specifically, to systems, methods, and circuits for reducing HUM modulation in amplifiers.

BACKGROUND OF THE INVENTION

Communication systems are used to transmit and deliver information to consumers in a variety of ways. These systems include satellite, cellular, and wireline networks, such as copper, coaxial, and fiber. The information that is passed through a communication system can be analog or digital and can be virtually anything, including telephony, video, and data.

An example of a communication system 100 is shown in FIG. 1. The communication system 100 includes headend equipment 105 for (generating forward signals that are transmitted in the downstream direction along a communication medium, such as a fiber optic cable 110, to an optical node 115 that converts optical signals to radio frequency (RF) signals. The RF signals are further transmitted along another communication medium, such as coaxial cable 120, and are amplified, as necessary, by one or more distribution amplifiers 125 positioned along the communication medium. Taps 130 included in the cable television system 100 split off portions of the forward signals for provision to subscriber equipment 135, such as set-top terminals, computers, and televisions. In a two-way system, the subscriber equipment 135 can also generate reverse signals that are transmitted upstream, amplified by any distribution amplifiers 125, converted to optical signals, and provided to the headend equipment 105.

For many communication systems, such as a cable distribution system, the signals that are ultimately delivered to the subscriber equipment 135 should be identical to the signals received by the headend equipment 105. In other words, the communication system 100 should not alter or otherwise distort the signals as they are being transmitted through the system 100. Various factors. however, interfere with the ability of the communication system 100 to deliver signals to the subscriber equipment 135 which are identical to the signals received at the headend equipment 105. One of these factors is the long distances over which the signals are transmitted to the multitude of subscribers. Over these long, distances, losses occur in the communication medium. hence the need for the amplifiers 125. Another factor that effects system performance is temperature. Cable distribution systems must operate over a wide rage of temperatures, such as −40° C. to +60° C. The performance of many components of the communication system 100, such as the amplifiers 125, is affected by temperature and fluctuations in temperature can distort the quality of the signals. In addition to distances and temperature, non-linearities in the system 100, such as within amplifiers 125, and noise can contribute to distortions that occur in downstream signals.

Because the system performance is influenced by these various factors, the system performance must be monitored and tested to ensure that quality signals are being transmitted by the headend equipment 105 and are being received at the subscriber equipment 135. For a cable distribution system, some examples of these tests or measurements include color tests to ensure that the signals produce the proper colors at the subscriber equipment 135, signal to noise ratio (S/N), carrier to noise ratio (C/N), percent modulation or depth of modulation, and hum modulation or modulation distortion of power frequencies. Many of these tests are desirable not only because they ensure proper performance of the communication system 100, but also because the Federal Communications Commission (FCC) has mandated minimum performance criteria.

The problem of hum modulation will be described in more detail with reference to FIGS. 2 and 3. Hum modulation is a measurement of a low frequency AM distortion of an RF carrier. For instance, with reference to FIG. 2, a signal S represents a signal that has been modulated with a carrier and is bounded within a signal envelope E. Hum modulation refers to an AM modulation of this envelope E which, as shown in FIG 2, causes the envelope E to fluctuate so as to have peaks and valleys. The precise measurement of hum modulation refers to the percentage of the peak to peak distortion to the peak signal level and FIG. 3 illustrates an example of the measurement of hum modulation for a single channel with a two volt horizontal sweep. According to the FCC, hum modulation shall not exceed three percent of the visual carrier level.

Hum modulation for a cable distribution system is undesirable since it distorts the picture that is available at the subscriber equipment 135. One or more horizontal bars that slowly roll through the picture at the subscriber equipment 135 is a typical manifestation of hum modulation. The AC power source and ground loops are common causes of hum modulation.

Hum modulation therefore is a significant concern in the distribution of signals in a communication system. A need exists for methods, systems, and circuits for reducing hum modulation so as to improve signal quality.

BRIEF DESCRIPTION OF THE DRAWINGS

The accompanying drawings., which are incorporated in and form a part of the specification illustrate preferred embodiments of the present invention and, together with the description, disclose the principles of the invention. In the drawings.

DETAILED DESCRIPTION

Reference will now be made in detail to preferred embodiments of the invention, non-limiting examples of which are illustrated in the accompanying drawings.

Figure 4:
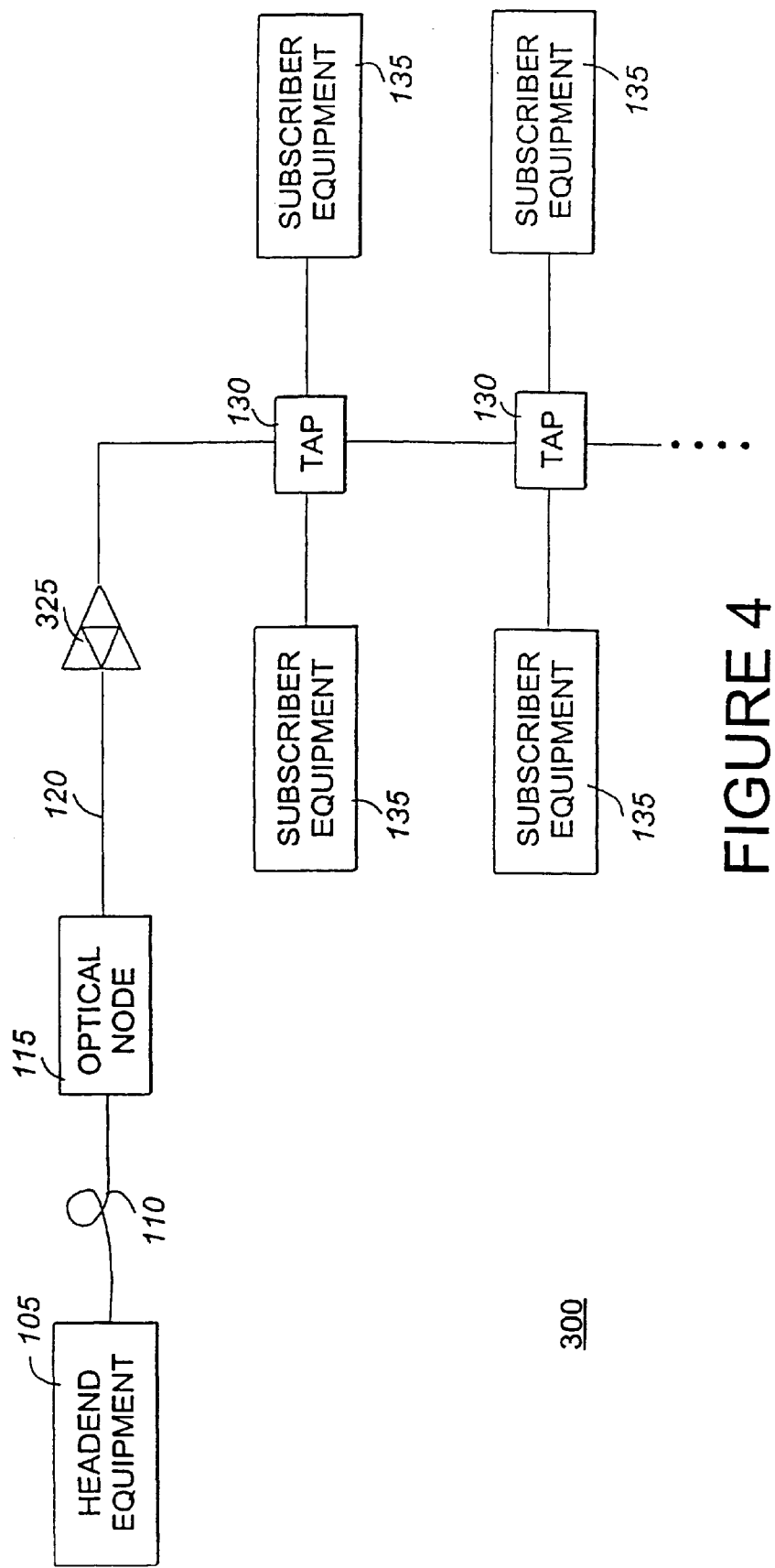
FIG. 4 is a block diagram of a communication system, such as a cable television system. according to a preferred embodiment of the invention.

With reference to FIG. 4, a communication system 300 according to a preferred embodiment of the invention includes headend equipment 105, optical nodes 115, taps 130, and subscriber equipment 135. The headend equipment 105 is for generating forward signals transmitted in the downstream direction along a communication medium which is preferably the optic cable 110. The optical nodes 115 convert the optical signals to RF signals and transmit them along a communication medium which is preferably the coaxial cable 120. One or more amplifiers 325 are positioned along the cable 120, as necessary, to amplify the signals. The taps 130 split off portions of the forward signals to the subscriber equipment 135, such as set-top terminals. computers, and televisions. The communication system 300 is preferably. but not necessarily, a two-way system in which reverse signals are transmitted upstream, amplified by the amplifiers 325, converted to optical signals, and provided to the headend equipment 105.

Figure 1:
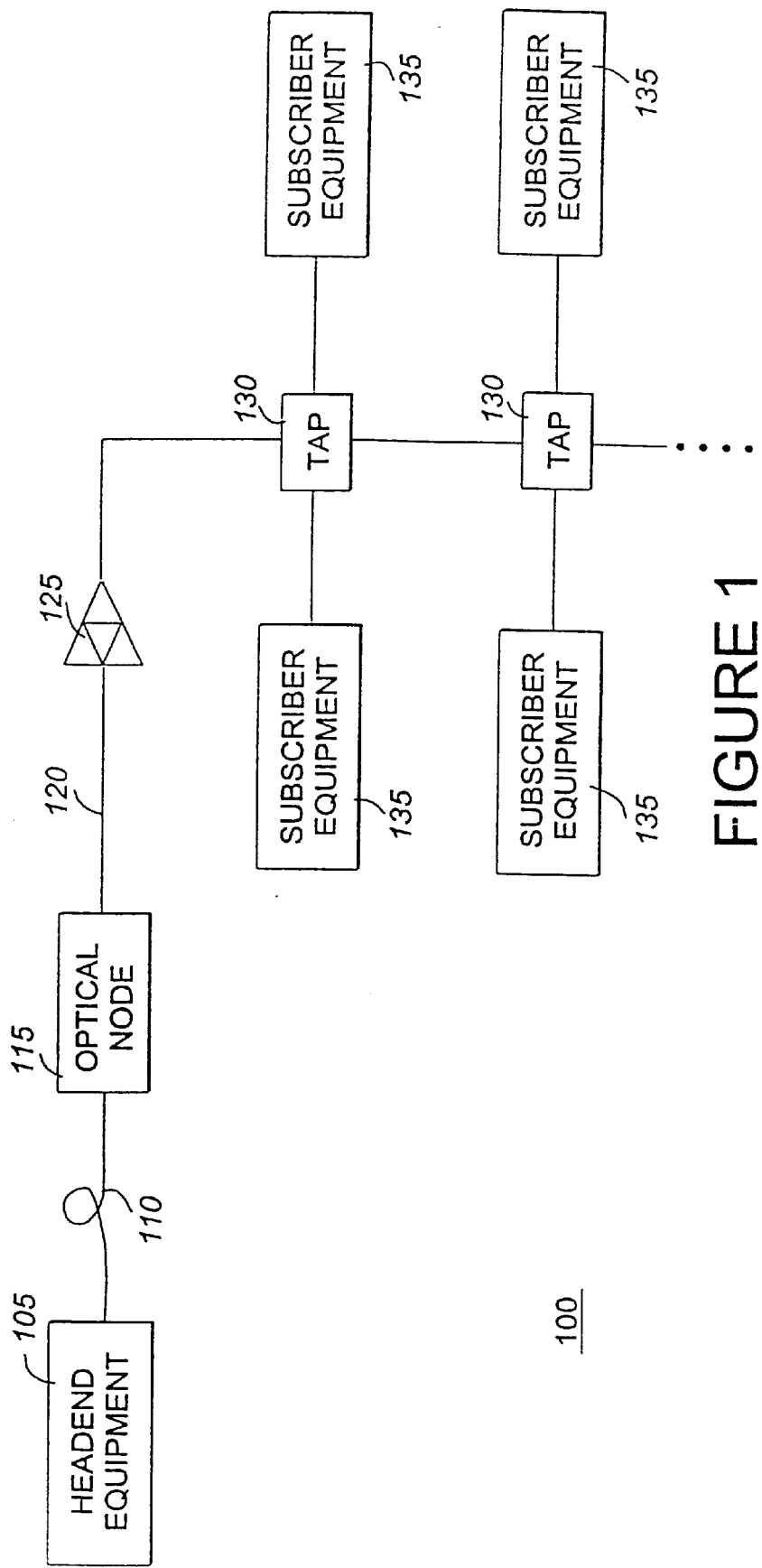
FIG. 1 is a block diagram of a conventional communication system, such as a cable television system.
Figure 2:
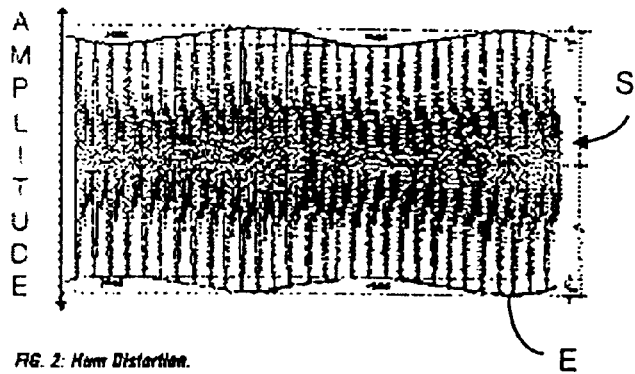
FIG. 2 is an example of a plot of a signal having hum distortion.
Figure 3:
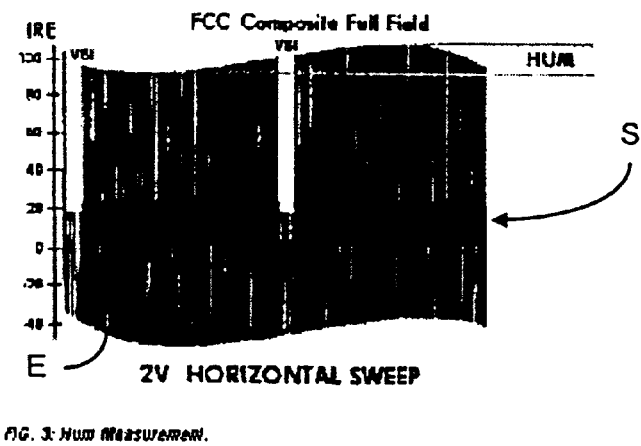
FIG. 3 is an example of a plot of a signal having hum distortion, the plot illustrating a measurement of hum modulation.

The communication system 300 differs from the communication system 100 shown in FIG. 1 in that the system 300 includes amplifiers 325 that have reduced the effects of hum modulation. The method, systems, and circuits for addressing hum modulation in the amplifiers 325 will be described below in more detail.

Figure 5:
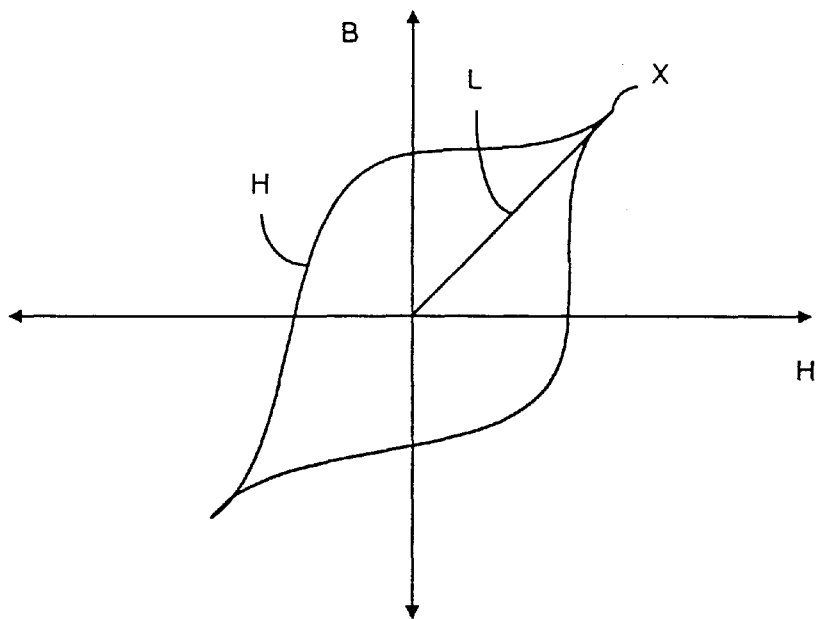
FIG. 5 is a plot of the magnetic field flux density versus magnetic field for bypass coils used in the amplifier 325.

The amplifiers 125 shown in FIG. 1 were determined to be one cause of hum modulation. Components within the amplifiers 125 that are responsible for hum modulation include the bypass coils. The bypass coils are a common element in amplifiers and are used to separate the AC path from the RF signal path which are fed into the amplifier 125 through the cable 120. FIG. 5 illustrates the bypass coils as having a linear region L of operation and a region of operation associated with a hysteresis loop H. The magnetic flux density B within the bypass coils increases linearly with the applied magnetic field H up to a point X. Within this linear region L, the relationship between the magnetic field H and magnetic flux density B is linear whereby any increase or decrease in magnetic field H produces a proportional increase or decrease in the magnetic flux density B. When the magnetic field H reaches the point X, the magnetic flux density B within the bypass coil begins to saturate. After saturation begins, the plot of the magnetic flux density B versus the magnetic field H no longer follows the linear relationship L but instead follows the hysteresis loop H. An overall consequence of the hysteresis is that the magnitude of the current passing through the gain-stage amplifiers fluctuates thereby introducing hum modulation.

A common approach to combating hum modulation is to use a bypass coil with a higher saturation of magnetic field which will extend the linear region L. By maintaining operation of the amplifiers 125 in their linear region L, the bypass coils do not become saturated and do not exhibit hysteresis. These larger bypass coils have significantly reduced the effects of current-induced hum modulation. Despite the use of the bypass coils in the amplifiers 125, the amplifiers 125 still exhibit some signs of hum modulation.

Figure 6:
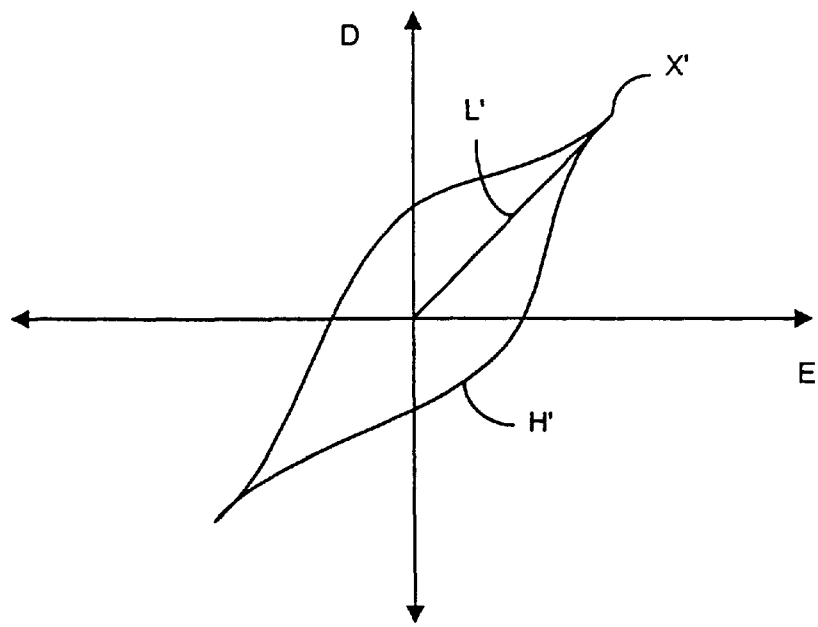
FIG. 6 is a plot of electric field flux density versus electric field for a shunt capacitor used in the amplifier of FIG. 4.

In an effort to further reduce hum modulation, it has been discovered that the shunt capacitors used in the amplifiers 125 introduce some voltage-induced hum modulation. The shunt capacitors are typically ceramic and are used to filter out transient voltage signals. With reference to FIG. 6, the shunt capacitors are characterized by a linear L' region of operation and a region of operation associated with a hysteresis loop H'. The electric field flux density D responds in a linear fashion to the changes in electric field E within the linear region L'. When the electric field F increases to a point X', the electric field flux density within the bypass capacitors begins to saturate, thereby forcing the shunt capacitors to enter the non-linear region defined by the hysteresis loop H'. An overall consequence of the shunt capacitors and other ferroelectric materials is to create a varying impedance.

In the non-linear operation of the shunt capacitors the impedance of the shunt capacitors vary thereby resulting in hum modulation. During the operation of the amplifier 125, the AC voltage powering the amplifier induces an alternating electric field across the bypass capacitor and drives the capacitor into saturation, and consequently to enter the hysteresis region of operation. Within the hysteresis region, the impedance of the shunt capacitors fluctuate with the applied voltage and hum modulation is produced.

Figure 7:
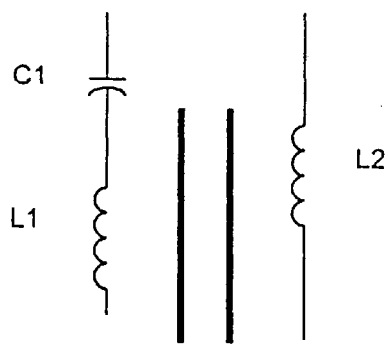
FIG. 7 is an effective circuit diagram illustrating magnetic coupling between the bypass coils and the shunt capacitors.

It has also been discovered that the shunt capacitors in amplifiers 125 are magnetically coupled to the bypass coils. As shown in an effective circuit diagram in FIG. 7, the shunt capacitors are represented by a capacitive component C1 and an inductive component L1. Interestingly, the leads of the shunt capacitors introduce the inductive component L1 of the shunt capacitors and this inductive component L1 is magnetically coupled to the bypass coils L2. The magnetic coupling between the bypass coils and the shunt capacitors allows energy from bypass coils to transfer over to the shunt capacitors, and vice versa. The energy received by the shunt capacitors can cause the shunt capacitors to saturate and enter their non-linear region. A maximum amount of energy is transferred to the shunt capacitors at a resonant frequency of the circuit shown in FIG. 7. Circuit impedances can change very rapidly at the resonant frequency, especially if the circuit has a high Q. For amplifiers that are used in a cable television system, the shunt capacitors have a value of 0.01 $\mu F$ and the resonant frequency is at about 11 MHz.

For a cable television system, the amplifier 125 typically has about 20 shunt capacitors and about 4 bypass coils. One approach to reducing the effects of the bypass coils on the shunt capacitors is to distance the shunt capacitors from the bypass coils. Due to space constraints within the amplifiers 125, this approach is impractical since the shunt capacitors will be placed in proximity to at least one of the bypass coils. Thus, the shunt capacitors remain magnetically coupled to one or more of the bypass coils.

The methods, systems, and circuits according to the invention involve dissipating energy that normally is passed through the shunt capacitors, including the energy transferred from the bypass coils. By dissipating the energy, the shunt capacitors do not store as much energy. Because less energy is stored in the shunt capacitors, the shunt capacitors remain in their linear region of operation more often or, in other words, enter the non-linear region less frequently. Consequently, the impedance of the shunt capacitors remains more stable. Overall. the performance of amplifiers 325 and of the system 300 overall with respect to hum modulation is improved.

Figure 8:
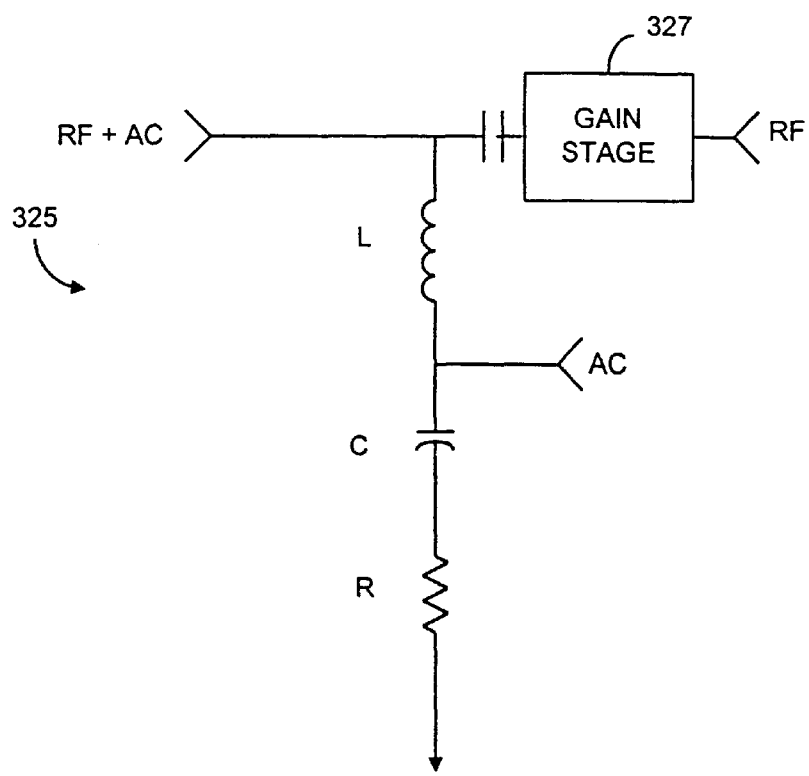
FIG. 8 is an example of a circuit diagram according to a preferred embodiment of the invention.

A preferred circuit for dissipating the energy is shown in FIG. 8. The amplifiers 325 have a gain stage 397 which is associated with the shunt capacitors C and the bypass coils L. As will be appreciated by those skilled in the art, the bypass coils and shunt capacitors C are located throughout the amplifier 325. Further, only one bypass coil L and one shunt capacitor C are shown in order to simplify the illustration of the amplifier 325 even though the amplifier 325 will actually have a number of shunt capacitors C and bypass coils L.

With reference to this figure, a resistance R is connected in series with each shunt capacitor C. During normal operation, energy that normally would be stored in the shunt capacitors C is dissipated by the resistor R. As discussed above, by dissipating this energy, the shunt capacitors C are better able to remain in their linear region where the impedance varies less and the voltage fluctuations can be filtered out. Even when the shunt capacitors are in the non-linear region, any fluctuation in impedance is effectively reduced by the resistor R. Furthermore, the effect of the magnetic coupling between the bypass coils L and the shunt capacitors C is substantially reduced by having some or all of this energy dissipated by the resistor R.

A benefit of the resistor R in dissipating energy is apparent from the representative plots of the Q of the shunt capacitor. First, with reference to FIG. 9(A). the shunt capacitors of the amplifier 125 shown in FIG. 1 have a relatively high Q. As discussed above, the response of the shunt capacitors resonates at about 11 MHz at which point the voltage-induced hum modulation is at a maximum. Because of this high Q, the impedance can vary greatly near the resonant frequency. In contrast. the response of a shunt capacitor C and resistor R represented by the plot in FIG. 9(B) has a lower Q. The resistor R is responsible for this lower Q by dissipating energy that is normally stored in the shunt capacitors and has a profound effect at the resonant frequency, when the transfer of energy from the bypass coils to the shunt capacitors is at a maximum.

In the preferred embodiment, the shunt capacitors have a capacitance of 0.01 F. Through empirical measurements, a value of 3.3 ohms was found to be effective for the resistor R in dissipating the energy passing through the shunt capacitors C. The invention is not limited to these values of shunt capacitors or resistors. Instead, any value of resistance that is found to dissipate the energy within the shunt capacitors may be used. The magnitude of the resistance R determines the extent to which energy is dissipated and cross-talk reduced. With higher values of the resistance R, the Q is lowered to a greater extent than the use of lower values of resistance. While even greater resistances may be used, another consideration in selecting the value of the resistance is bypass ability. Higher values of the resistance R worsen the RF bypassing ability, therefore lowering the gain of the overall amplifier. Thus, the value of the resistance for the resistor R should be carefully chosen to reduce hum modulation but not to degrade the bypass ability of the bypass capacitor.

The forgoing description of the preferred embodiments of the invention has been presented only for the purpose of illustration and description and is not intended to be exhaustive or to limit the invention to the precise forms disclosed. Many modifications and variations are possible in light of the above teaching.

The embodiment was chosen and described in order to explain the principles of the invention and their practical application so as to enable others skilled in the art to utilize the invention and various embodiments and with various modifications as are suited to the particular use contemplated.

What is claimed:

1. An amplifier being susceptible to transient voltage signals to produce hum modulation in an output signal, comprising:
    a gain stage for amplifying an input signal and for generating the output signal;
    a bypass coil;
    a shunt capacitor associated with the gain stage that is physically and magnetically coupled to the bypass coil for use in removing the transient voltage signals, the shunt capacitor having a linear region of operation in which an electric flux density essentially varies linearly with an applied electric field and a non-linear region defined by a hysteresis loop; and
    a resistance connected in series with the shunt capacitor for dissipating energy;
    wherein the resistance reduces energy stored in the shunt capacitor so as to prolong operation of the shunt capacitor in the linear region and to allow the shunt capacitor to be better able to remove the transient voltage signals, thereby improving performance of the amplifier with respect to hum modulation.

2. An amplifier, comprising:
    a gain stage for amplifying an input signal and for generating an output signal;
    a bypass coil;
    a shunt capacitor associated with the gain stage that is physically and magnetically coupled to the bypass coil, the shunt capacitor having a linear region of operation in which an electric flux density essentially varies linearly with an applied electric field and a non-linear region defined by a hysteresis loop; and
    a resistance connected in series with the shunt capacitor for dissipating energy;
    wherein the resistance reduces energy stored in the shunt capacitor and reduces a range over which an impedance of the shunt capacitor varies, thereby improving performance of the amplifier with respect to hum modulation.

3. A method of reducing hum modulation in a communication system, comprising:
    amplifying an input signal and providing an amplified output signal, wherein amplifying the input signal includes using a bypass coil to reduce current variations;
    filtering transient voltages during the amplifying of the input signal, the filtering comprising using a capacitor;
    connecting a resistance in series with the capacitor; and
    dissipating, with the resistance, energy that normally would pass through the capacitor, wherein dissipating includes dissipating energy transferred from the bypass coil to the capacitor;
    wherein the dissipating of the energy reduces a range within which an impedance associated with the capacitor varies and improves a performance of the communication system with respect to hum modulation.

* * * * *

UNITED STATES PATENT AND TRADEMARK OFFICE
CERTIFICATE OF CORRECTION

PATENT NO. : 6,285,253 B1
DATED : September 4, 2001
INVENTOR(S) : Ao et al.

It is certified that error appears in the above-identified patent and that said Letters Patent is hereby corrected as shown below:

Column 1,
Line 22, delete "(generating" and insert therefore -- generating --
Line 44, delete "factors." and insert therefore -- factors, --
Line 50, delete the comma after "long" and delete "medium." and insert therefore -- medium, --

Column 2,
Line 35, delete "drawings.," and insert therefore -- drawings, --
Line 36, insert a comma after "specification"

Column 3,
Line 13, delete "terminals." and insert therefore -- terminals, --
Line 15, delete "preferably." and insert therefore -- preferably, --
Line 47, insert a comma after "fluctuates"
Line 66, delete "F" and insert therefore -- E --

Column 4,
Line 5, insert a comma after "capacitors"
Line 52, delete "Overall." and insert therefore -- Overall, --
Line 56, delete "397" and insert therefore -- 327 --
Line 59, insert "L" between "coils" and "and"

UNITED STATES PATENT AND TRADEMARK OFFICE
CERTIFICATE OF CORRECTION

PATENT NO. : 6,285,253 B1
DATED : September 4, 2001
INVENTOR(S) : Ao et al.

Figure 9A:
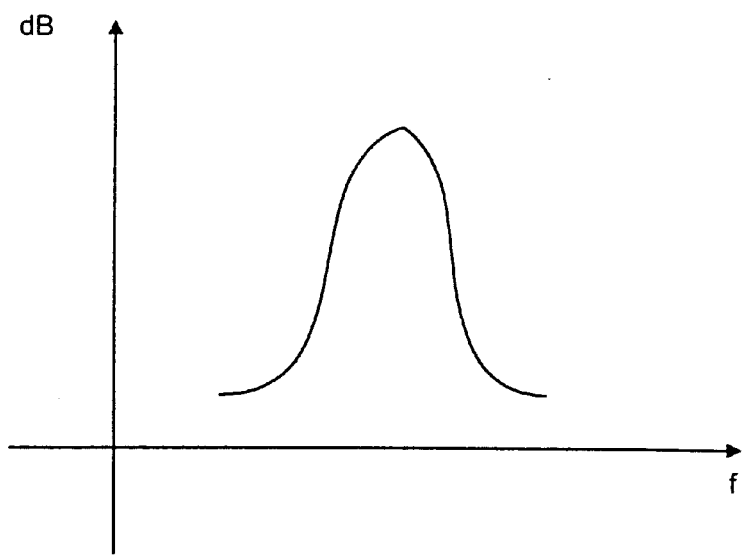
FIG. 9A is an example of a plot of the Q of the shunt capacitor in a conventional amplifier.
Figure 9B:
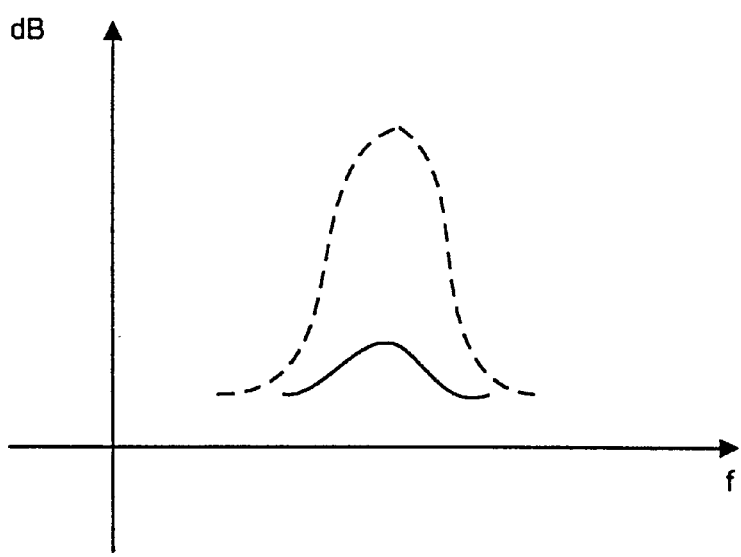
FIG. 9B is a plot of the Q of the shunt capacitor circuit shown in FIG. 8.

It is certified that error appears in the above-identified patent and that said Letters Patent is hereby corrected as shown below:

<u>Column 5,</u>
Line 4, delete "the" between "and" and "voltage"
Line 14, delete "FIG. 9(A)." and insert therefore -- FIG. 9(A), --
Line 20, delete "contrast." and insert therefore -- contrast, --
Line 29, delete "F." and insert therefore --$\mu$F. --

Signed and Sealed this

Eleventh Day of June, 2002

*Attest:*

JAMES E. ROGAN
*Attesting Officer*       *Director of the United States Patent and Trademark Office*